(12) United States Patent
Johansson et al.

(10) Patent No.: US 7,573,313 B2
(45) Date of Patent: Aug. 11, 2009

(54) LOGIC LEVEL VOLTAGE TRANSLATOR

(75) Inventors: Brian David Johansson, Wellesley, MA (US); Stuart Patterson, East Walpole, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 11/205,475

(22) Filed: Aug. 17, 2005

(65) Prior Publication Data

US 2005/0275445 A1    Dec. 15, 2005

Related U.S. Application Data

(62) Division of application No. 10/786,357, filed on Feb. 25, 2004, now abandoned.

(51) Int. Cl.
*H03L 5/00* (2006.01)
(52) U.S. Cl. .......................... 327/333; 326/68
(58) Field of Classification Search ................ 327/143, 327/333, 198; 326/68, 81, 63
See application file for complete search history.

(56) References Cited

U.S. PATENT DOCUMENTS

| 5,418,477 | A  | * | 5/1995  | Dhong et al. ............. 326/81  |
| 5,457,420 | A  |   | 10/1995 | Asada ..................... 327/333 |
| 6,043,699 | A  |   | 3/2000  | Shimizu .................. 327/333 |
| 6,373,285 | B1 | * | 4/2002  | Konishi ................... 326/81  |
| 6,414,534 | B1 |   | 7/2002  | Wang et al. ............... 327/333 |
| 6,489,828 | B1 |   | 12/2002 | Wang et al. ............... 327/333 |
| 6,556,061 | B1 |   | 4/2003  | Chen et al. ............... 327/333 |
| 6,650,168 | B1 | * | 11/2003 | Wang et al. ............... 327/333 |
| 6,781,413 | B2 | * | 8/2004  | Kihara et al. ............. 327/333 |
| 6,894,537 | B1 | * | 5/2005  | Wert ....................... 326/68  |
| 7,005,908 | B2 | * | 2/2006  | Lee et al. ................ 327/333 |

OTHER PUBLICATIONS

Wen-Tai Wang et al., Level Shifters for High-Speed 1-V to 3.3 V Interfaces in a 0/13-μm Cu-Interconnection/Low-k CMOS Technology; pp. 307-310, 2001 IEEE.
Texas Instruments Translation Overview; pp. 1-4, 2003.
"Voltage Level Translating Circuit", Oct. 1959, IBM Technical Disclosure Bulletin.
Voltage Level Translation Circuit:, Jun. 1975, pp. 1-2, IBM Technical Disclosure Bulletin.
Charles D. Rakes, "Circuit Circus", pp. 59-62; Mar. 1999, Popular Electronics.
Cascaded Common-Gate FET IC Provides Flexible Level Translation:, Electronic Design, pp. 1 of 5; Feb. 3, 2004.

* cited by examiner

*Primary Examiner*—Lincoln Donovan
*Assistant Examiner*—Thomas J Hiltunen
(74) *Attorney, Agent, or Firm*—Wolf, Greenfield & Sacks, P.C.

(57) ABSTRACT

A voltage level translator provides an output signal having an external voltage in response to an input signal having an internal voltage. The voltage level translator includes first and second input signal transistors, first and second output signal transistors, and includes a signal stabilization circuit and/or an enable circuit. A ready-signal generation circuit provides a ready signal indicating that a voltage supply is at an operating voltage. The ready-signal generation circuit can include unbalanced transistors.

17 Claims, 5 Drawing Sheets

LOGIC LEVEL VOLTAGE TRANSLATOR

RELATED APPLICATIONS

This application is a divisional of and claims priority to U.S. patent application Ser. No. 10/786,357, filed Feb. 25, 2004, now abandoned, which is incorporated herein by reference.

BACKGROUND OF INVENTION

1. Field of Invention

The invention relates to operating voltage levels of integrated circuits. In particular, the invention relates to apparatus and methods for translating voltage levels of signals traveling between integrated circuits that operate at different voltage levels.

2. Discussion of Related Art

Electronic systems often include circuits that operate at relatively low voltages, at times including core logic circuits and memory circuits, and other circuits that operate at higher voltages. Such mixed-mode voltage systems typically require voltage translation and voltage clamping capabilities. Voltage translation components allow proper communication of the I/O signals traveling between circuits operating at different voltage levels.

Circuits that employ transistors having smaller gate dimensions typically require an associated decrease in supply voltage level. Microprocessors and memory circuits, for example, often are fabricated with transistors having the smallest possible gate sizes. Thus, electronic systems, such as a cellular telephones and personal computers, will typically have components, such as processors, that operate at a low internal voltage, and additional components that operate at a relatively high external voltage. While an internal voltage supply may provide, for example, 2.5V, 1.5V or 0.9V, external voltage supplies may provide, for example, 5V, 3.3V or 2.5V.

Voltage translation circuits can provide uni- or bidirectional conversion of the low- and high-voltage signals produced by the circuits using the different supply voltage levels. Often, for example, a level-shifting circuit is used to increase the upper voltage-level swing of the low-voltage signals produced by high-performance complimentary metal-oxide-semiconductor (CMOS) logic devices. Unfortunately, a level-shifting circuit may fail to function properly when an internal voltage supply is producing less than its full operating voltage. Moreover, level-shifting circuits can introduce distortions and/or delays in the low-voltage signals that they convert to high-voltage signals.

SUMMARY OF INVENTION

The invention arises, in part, from the realization that a voltage level shifting circuit can include an enabling circuit to prevent incorrect operation and unnecessary power use when an internal voltage supply is not ready for normal operation. The invention also arises, in part, from the realization that a voltage level shifting circuit can include a signal stabilizing circuit to improve, for example, the shape and delay characteristics of a shifted signal.

Accordingly, in a first aspect, the invention features a voltage level translator that provides an output signal having an external voltage in response to an input signal having an internal voltage. The voltage level translator includes first and second input signal transistors, first and second output signal transistors, and includes a signal stabilization circuit and/or an enable circuit.

The gate of the first input signal transistor receives the input signal, and the gate of the second input signal transistor receives an input complementary signal. The drain of the first output signal transistor is connected to the gate of the second output signal transistor, to the drain of the first input signal transistor, and to an output complementary signal node. The drain of the second output signal transistor is connected to the gate of the first output signal transistor, to the drain of the second input signal transistor, and to an output signal node. The signal stabilization circuit is connected to the drains of the first and second input signal transistors to modify a pulse parameter of the output signal at the output signal node.

The first and second output signal transistors can be high voltage transistors. The external voltage can have a value in a range of, for example, about 2.0 volts to about 10.0 volts, and the internal voltage can have a value in a range of, for example, about 0.5 volt to about 2.0 volts. The first and second input signal transistors can be n-channel MOS (NMOS) transistors. The first and second input signal transistors can be low voltage transistors.

The translator can further include first and second high voltage transistors that each have essentially zero threshold voltage and mediate the connection between the first and second input signal transistors and the first and second output signal transistors. The translator can further include a cascode circuit. The zero-threshold transistors and the cascode circuit can protect the drains of the first and second input signal transistors from the external voltage.

The signal-stabilization circuit can include first and second signal stabilization transistors. The drain of the first signal-stabilization transistor can be connected to the drain of the first input signal transistor, and the drain of the second signal-stabilization transistor can be connected to the drain of the second input signal transistor. The sources of the first and second signal-stabilization transistors can be connected to an internal voltage supply. The gate of the first signal-stabilization transistor can receive the input signal, and the gate of the second signal-stabilization transistor can receive the input complementary signal. The first and second signal-stabilization transistors can be low-voltage p-channel MOS (PMOS) transistors, and the first and second output signal transistors can be PMOS transistors.

The enable circuit has a first state that connects an external voltage supply to the sources of the first and second output signal transistors, and a second state that isolates the external voltage supply from the sources of the first and second output signal transistors in response to a signal that indicates the readiness of an internal voltage supply. The enable circuit can include first and second high voltage PMOS transistors having gates that receive the signal indicating that the internal voltage supply is ready.

The voltage level translator can further include a ready-signal generation circuit that delivers an external high voltage signal to the enable circuit to indicate that the internal voltage supply is ready for safe operation.

In a second aspect, the invention features a ready-signal generation circuit for providing a ready signal indicating that a voltage supply is at an operating voltage. The circuit includes a pair of input transistors. The gate of first input transistor receives the input signal, and the gate of the second input transistor receives an input complementary signal.

The ready-signal generation circuit also includes a pair of output transistors. The drain of the first output transistor is connected to the gate of the second output transistor, to the drain of the first input transistor, and to an output complementary signal node. The drain of the second output transistor is connected to the gate of the first output transistor, to the drain of the second input transistor, and to an output signal node. At least one of the pairs of input transistors and output transistors are unbalanced. An unbalanced pair can be unbalanced by, for example, connecting a resistive element in parallel with one of the transistors of the pair. Alone or in combination with the resistive element, the unbalanced pair can be unbalanced by, for example, having different parameters, such as different gate dimensions.

The ready-signal generation circuit can further include first and second high voltage transistors that each have essentially zero threshold voltage, and that mediate the connections between the pair of input signal transistors and the pair of output signal transistors.

BRIEF DESCRIPTION OF DRAWINGS

The accompanying drawings, are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
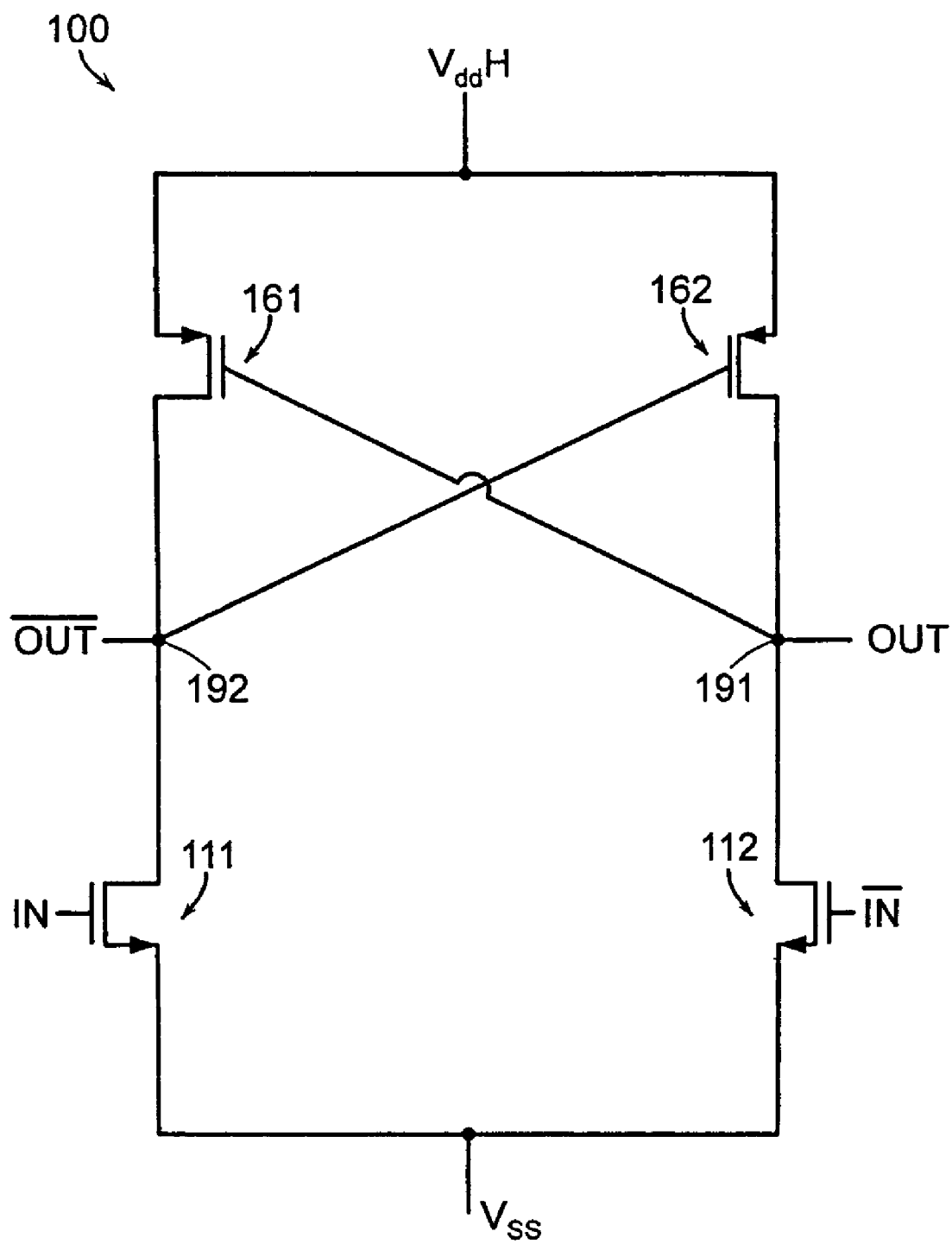
FIG. 1 is a schematic diagram of an example of a conventional voltage level translator that converts an internal signal to an external signal.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

The term "connected" is herein used to refer to components that are either in direct or indirect electrical communication. A direct connection is an uninterrupted interconnect pathway having an essentially non-variable resistance. An indirect connection includes additional components, such as transistors. Thus, an indirect connection can be variable. For example, the connection can have a variable resistance and/or can have a conductive state and an open state. For example, as generally used herein, two connected components may be connected via a transistor that provides a conductive path or an open circuit, depending on the state of the transistor.

The terms "core," "internal," and "low," depending on context, herein refer to components configured to operate with a voltage supply provides a relatively low voltage. These terms also may refer to such a supply, for example, a supply providing a voltage selected from a range of about 0.70 V to about 1.25 V ("VddL"). The terms "I/O," "external," and "high," depending on context, herein refer to components that are configured to operate with a voltage supply that provides a relatively high voltage. These terms also may refer to such a supply, for example, a supply providing a voltage selected from a range of about 2.25 V to about 3.75 V ("VddH"). A ground voltage ("Vss") is typically at zero volt.

For convenience, transistors that operate at a high voltage are in some instances herein referred to as "3V" transistors, and transistors that operate at a low voltage are in some instances herein referred to as "1V" transistors. This terminology is not, however, intended to limit the scope of the invention to the use of transistors operating at 1V and 3V.

FIG. 1 is a schematic diagram of an example of a conventional voltage level translator 100 that converts an internal signal to an external signal. The translator 100 includes a differential transistor pair of four high-voltage transistors 111, 112, 161, 162. Two of the transistors 111, 112 are NMOS-type; the gates of these transistors 111, 112 receive an internal signal (IN) and an internal complementary signal (INbar). The remaining two transistors 161, 162 are PMOS-type; the drains of these transistors 161, 162 are connected to an output signal node 191 and an output complementary signal node 192. As would be understood by one having ordinary skill in the microprocessor circuit arts, the translator 100, in cooperation with other circuit components, can convert, for example, core logic signals of a low-voltage level to I/O signals of a high-voltage level.

Figure 2:
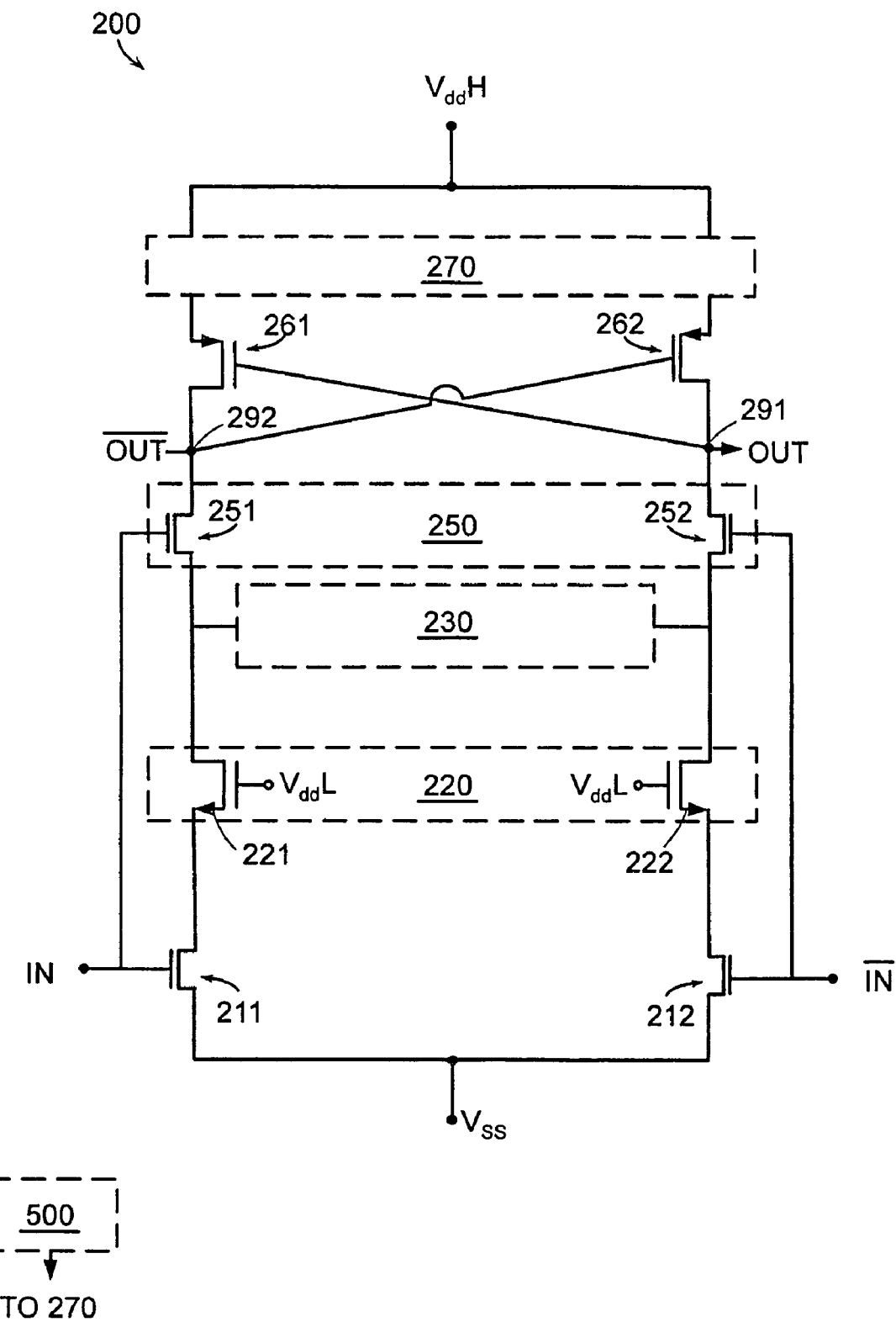
FIG. 2 is a schematic diagram of an embodiment of a voltage level translator, according to principles of the invention.

Now referring to FIG. 2, various embodiments of the invention can provide voltage level translation with circuit-protection features and/or output-signal stabilization features. FIG. 2 is a schematic diagram of an embodiment of a voltage level translator 200, according to principles of the invention. The translator 200 includes a pair of input-signal transistors 211, 212 and a pair of output-signal transistors 261, 262. The gates of the input-signal transistors 211, 212 each receive one of a corresponding input signal and input complementary signal. The drains of the output-signal transistors 261, 262 are each connected to a corresponding one of an output-signal node 291 and an output complementary signal node 292.

The translator 200 also includes an enable circuit 270 and/or a signal stabilization circuit 230. The enable circuit 270 may receive an internal supply-ready signal from an internal supply-ready signal generator 500. The internal supply-ready signal generator 500 will be described in more detail with reference to FIG. 5. The translator 200 may also include a cascode circuit 220, which can help to protect the input-signal transistors 211, 212, and will be described in more detail below.

The voltage level translator 200 can be included in, for example, a microprocessor to convert low-voltage signals output by the processor core into input signals for, for example, I/O circuitry. For example, each output-signal pad of a processor can have an associated translator 200 to shift the low-voltage signal produced by the processor to a high-voltage signal that can properly interact with high-voltage external circuitry. In this example, if the processor has 128 output pads, the processor can include, for example, 128 translators 200.

The translator 200 circuitry can be located in the periphery of the processor circuitry. Alternatively, the translator 200 circuitry can be located internally to the processor circuitry. Moreover, core logic and I/O circuitry can be located on a single integrated circuit chip, or can be on separate chips.

The input-signal transistors 211, 212 are preferably 1V NMOS transistors. In this case, the translator 200 preferably includes a native-transistor circuit 250 to, in part, protect the input-signal transistors 211, 212. The embodiment of a native-transistor circuit 250 shown in FIG. 2 includes two 3V NMOS transistors 251, 252. The gates of the transistors 251, 252 can receive the input and input complementary signals, as shown, or may be connected to a low-voltage supply.

The transistors 251, 252 have threshold voltages of about 0 volt, as controlled by the doping of channel regions during fabrication. For example, a threshold dopant implant step may be skipped for fabrication of the transistors 251, 252. The transistors 251, 252 thus have threshold voltages that permit proper functioning in response to received input signals. That is, the transistors have threshold voltage levels less than that of an internal-voltage supply. The native transistors 251, 252 can work in cooperation with the input signal transistors 211, 212 to increase the switching speed of the translator 200.

Due to their low threshold voltages, the native transistors 251, 252 can reliably turn on in response to core voltage signals. Moreover, because the native transistors 251, 252 are 3V devices, they can reliably handle external supply voltages. For example, the native transistors 251, 252 can operate at voltages up to 10 V or greater.

The native transistors 251, 252 also shield the low-voltage input-signal transistors 211, 212 from high voltages. By permitting reliable use of low-voltage transistors in the translator 200, low-voltage transistors can be used to provide better switching behavior. Since the translator 200 can utilize low-voltage transistors, which can be small in area relative to high voltage transistors, the low-voltage input signal transistors 211, 212, can help to conserve device area.

The output signal transistors 261, 262 are preferably 3V PMOS transistors. The output signal transistors 261, 262 can cooperate with the input signal transistors 211, 212 and the native transistors 251, 252 to apply an output signal to the output-signal node 291 in correspondence with the input signal received by the input-signal transistor 211.

The cascode circuit 220 can include two 1V NMOS transistors 221, 222. The gates of the transistors 221, 222 each receive one of the input signal and the input complementary signal. The drains of the transistors 221, 222 are each connected to a corresponding one of the native transistors 251, 252. The sources of the transistors 221, 222 are each connected to a corresponding one of the input-signal transistors 221, 212. The transistors 221, 222 can help to protect the input-signal transistors 211, 212. This can be helpful in part because the sub-threshold leakage currents of the native transistors 251, 252 can be poorly characterized. The cascode circuit 220 can shield the drains of the input-signal transistors 211, 212 from seeing all of the high-voltage swing.

Figure 3:
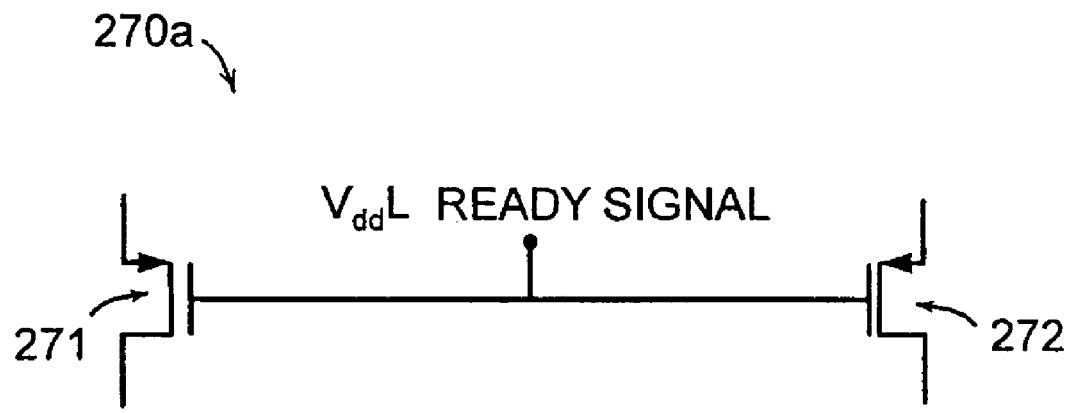
FIG. 3 is schematic diagram of an embodiment of an enable circuit, according to principles of the invention.

FIG. 3 is schematic diagram of an embodiment of an enable circuit 270a, which can serve as the circuit 270 shown in FIG. 2. The enable circuit 270a includes two 3V PMOS transistors 271, 272. Each of the transistors 271, 272 is connected between the high-voltage supply and the source of one of the output-signal transistors 261, 262. The gates of the transistors 271, 272 receive an internal supply-ready signal from, for example, the internal supply-ready signal generator 500. When the ready signal is received, as, for example, a 3V signal, the transistors 271, 272 are turned on and the translator permitted to function. The enable circuit 270a thus can prevent erroneous functioning of the translator 200 and circuits supported by the translator 200, when an internal power supply has not achieved normal operating conditions.

The enable circuit 70 helps to assure that the output-signal transistors 261, 262 flip states in response to an input signal. If the internal supply fails to support a proper state transition of the output-signal transistors 261, 262, a direct current ("DC") path can appear leading to a DC discharge through the voltage level translator 200. The internal supply can cause this problem when its voltage level is below the level required for proper transistor operation. The enable circuit 270 can thus disable the translator and avoid the occurrence of a DC path through the translator 200.

A device, such as a processor, can include, for example, a second translator 200 to provide an output enable signal in addition to the first translator 200 that provides the output signal. An output enable signal can be delivered to external circuit components for their use in determining when, for example, interaction with the processor is possible.

Figure 4:
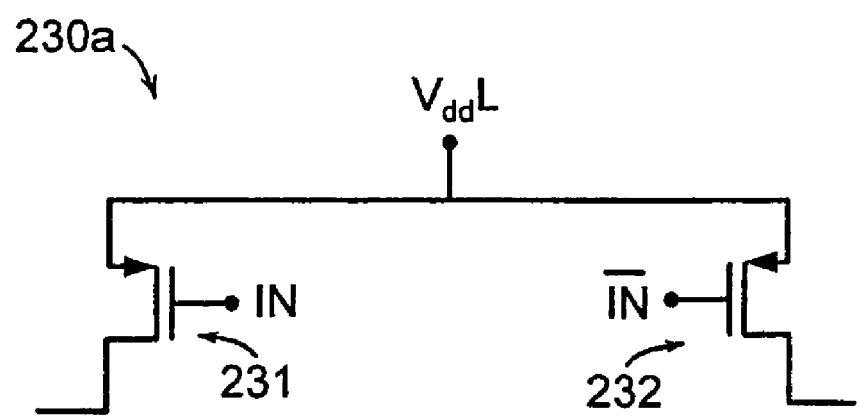
FIG. 4 is schematic diagram of an embodiment of a signal-stabilization circuit, according to principles of the invention.

FIG. 4 is a schematic diagram of an embodiment of a signal-stabilization circuit 230a, which can serve as the circuit 230 shown in FIG. 2. The stabilization circuit 230a includes two 1V PMOS transistors 231, 232. Each of the transistors 231, 232 has a drain connected to one of the drains of the input signal transistors 211, 212. The transistors 221, 220 of the cascode circuit 220 can mediate the connections of the input signal transistors 211, 212 to the stabilization circuit 230a.

The stabilization circuit 230a can provide, for example, a more consistent and accurate signal pulse width, and a balanced rise and fall time. That is, the output signal of the translator 200 can then better match the input signal. The circuit 230a can also provide a speed improvement for the translator 200. Further, the circuit 230a can act as a voltage clamp to protect the input-signal transistors 211, 212 from a high voltage.

Thus, the stabilization circuit 230a can help to ensure that the pulse width of output logic signals remain close to that of incoming logic signals. Signal integrity can be desirable, for example, when an electronic system utilizes a precise internal time reference that should be preserved externally.

Figure 5:
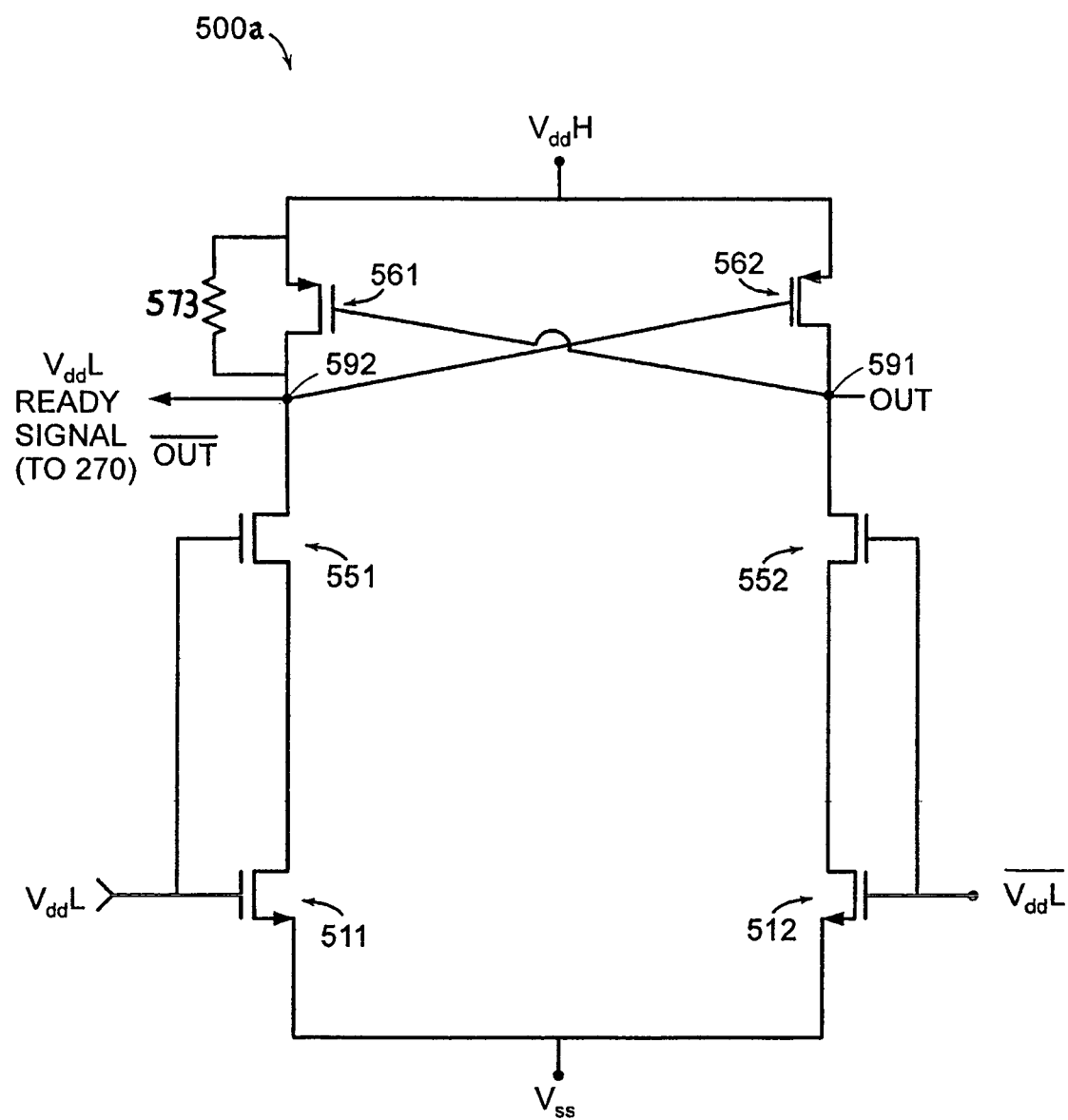
FIG. 5 is schematic diagram of a embodiment of a supply-ready signal generator, according to principles of the invention.

Now referring to FIG. 5, various embodiments of the voltage level translator 200 are well suited for use as the supply-ready signal generator 500. Thus, each pad of a microprocessor can have, for example, a translator 200 to provide an output voltage signal, and a generator 500 to provide a ready signal to the translator 200.

FIG. 5 is schematic diagram of a more detailed embodiment of a supply-ready signal generator 500a, which can advantageously serve as the generator 500 shown in FIG. 2. The supply-ready signal generator 500a includes a pair of input-signal transistors 511, 512, which can be 1V NMOS-type, and a pair of output-signal transistors 561, 562, which can be 3V PMOS-type. The gates of the input-signal transistors 511, 512 each receive one of a corresponding input signal and input complementary signal. The drains of the output-signal transistors 561, 562 are each connected to a corresponding one of an output-signal node 591 and an output complementary signal node 592. The generator 500a also includes two low threshold voltage 3V NMOS transistors 551, 552. The gates of the transistors 551, 552 receive input and input complementary signals from the internal-voltage supply. The generator 500a also can include a resistive component 573, including, for example, a chain of resistors, connected in parallel with one of the output-signal transistors 561.

The parameters of the transistors 511, 512, 561, 562 are preferably chosen to place the generator 500a out of balance. For example, the width-to-length ratios (W/L) of gate dimensions can be chosen so that W/L for one output-signal transistor 561 is less than W/L for the other output-signal transistor 562. Similarly, gate dimensions can be chosen so that W/L for one input-signal transistor 512 is less than W/L for the other output-signal transistor 511.

Thus, the conductance of one input-signal transistor 511 is weaker than the other input-signal transistor 512. Similarly, the conductance of one output-signal transistor 562 is weaker than the other output-signal transistor 561. The resistive component 573 can pull up the output complementary signal node 592, which must be pulled down by a weak input-signal transistor 511 and a low threshold voltage transistor 551.

The pair of output transistors 561, 562 can also be unbalanced by inclusion of the resistive component 573. As will be understood by one having ordinary skill in the voltage-shifting circuit arts, resistive components and/or mismatched transistor parameters can be employed to provide an out-of-balance generator 500a.

Functionally, the generator 500a produces a ready signal at an external (high) voltage in response to reception of an inner voltage that exceeds a preset safe voltage level for an internal voltage supply. Thus, the supply-ready signal generator 500a detects a ready condition of an internal voltage supply, and responsively produces an internal-supply ready signal. The ready signal can be delivered to, for example, the enable circuit 270. In turn, the enable circuit 270 can permit operation of the voltage translator 200.

Because the transistors of a device as-fabricated are typically well matched, the intentionally unbalanced transistors of the supply-ready signal generator 500a can provide a good test of a safe internal operating voltage. The out-of-balance nature of the supply-ready signal generator 500a can assure that a signal will not be generated by the unbalanced circuit of the supply-ready signal generator 500a unless the supply voltage is also sufficient to properly operate other low-voltage transistors in the device. So, for example, by the time the supply-ready signal generator 500a is capable of providing a high-voltage internal-supply ready signal, the translation circuit 200, which is preferably balanced, will typically function correctly.

Figure 6:
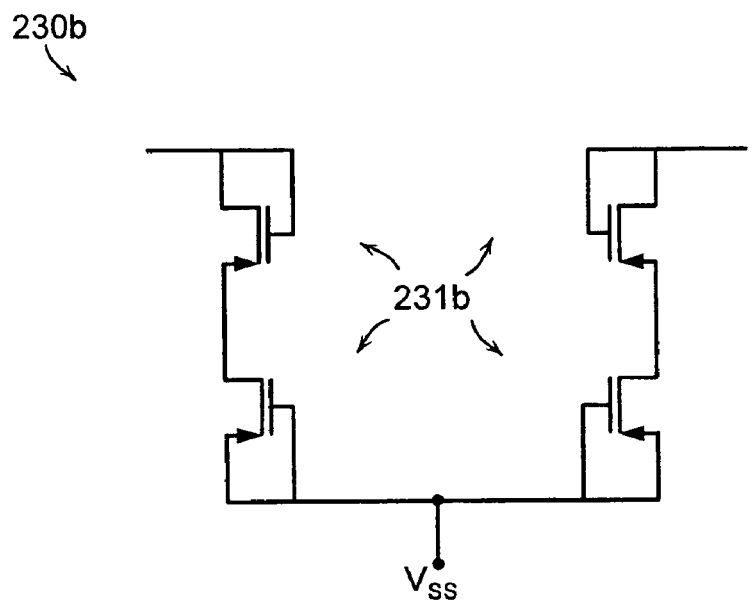
FIG. 6 is schematic diagram of an embodiment of a signal-stabilization circuit, according to principles of the invention.
Figure 7:
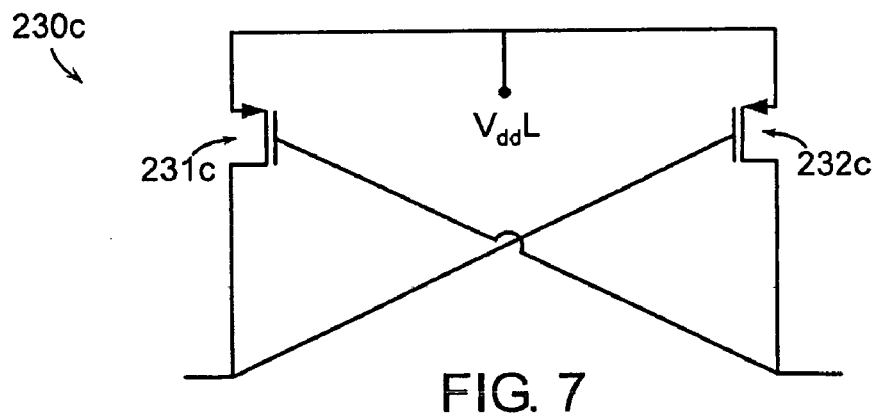
FIG. 7 is schematic diagram of an embodiment of a signal-stabilization circuit, according to principles of the invention.
Figure 8:
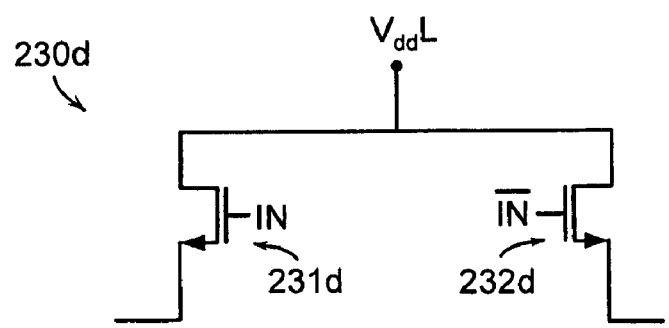
FIG. 8 is schematic diagram of an embodiment of a signal-stabilization circuit, according to principles of the invention.

Now referring to FIGS. 6, 7 and 8, some alternative embodiments of signal-stabilization circuits are described. FIG. 6 is schematic diagram of an embodiment of a signal-stabilization circuit 230b, which can serve as the circuit 230 shown in FIG. 2. The stabilization circuit 230b includes four 1V PMOS transistors 231b. The transistors 231b have their drains connected in series to one of the drains of the input-signal transistors 211, 212. The transistors 221, 220 of the cascode circuit 220 can mediate the connections of the input-signal transistors 211, 212 to the stabilization circuit 230a.

FIG. 7 is schematic diagram of another embodiment of a signal-stabilization circuit 230c, which can serve as the circuit 230 shown in FIG. 2. The stabilization circuit 230c includes two 1V PMOS transistors 231c, 232c. Each of the transistors 231c, 232c has a drain connected to one of the drains of the input-signal transistors 211, 212. FIG. 8 is schematic diagram of still another embodiment of a signal-stabilization circuit 230d, which can serve as the circuit 230 shown in FIG. 2. The stabilization circuit 230d includes two 1V PMOS transistors 231, 232. Each of the transistors 231d, 232d has a drain connected to one of the drains of the input-signal transistors 211, 212.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A circuit comprising:
 a ready-signal generation circuit for providing a ready-signal indicating that an internal voltage supply is at an operating voltage, the ready-signal generation circuit comprising
  a pair of input transistors, the gate of a first input transistor of the pair of input transistors receiving a signal from the internal voltage supply, and the gate of a second input transistor of the pair of input transistors receiving a complementary signal of the signal from the internal voltage supply, and
  a pair of output transistors,
  the drain of a first output transistor of the pair of output transistors connected to the gate of a second output transistor of the pair of output transistors, to the drain of the first input transistor, and to an output complementary signal node of the ready-signal generation circuit,
  the drain of the second output transistor connected to the gate of the first output transistor, to the drain of the second input transistor, and to an output signal node of the ready-signal generation circuit,
  wherein at least one of the pairs of input transistors and output transistors is permanently unbalanced; and
 a voltage level translator for providing an output signal having an external voltage in response to an input signal having an internal voltage, the voltage level translator comprising
  first and second input signal transistors, the gate of the first input signal transistor receiving the input signal, and the gate of the second input signal transistor receiving an input complementary signal of the input signal;
  first and second output signal transistors,
  the drain of the first output signal transistor connected to the gate of the second output signal transistor, to the drain of the first input signal transistor, and to an output complementary signal node of the voltage level translator,
  the drain of the second output signal transistor connected to the gate of the first output signal transistor, to the drain of the second input signal transistor, and to an output signal node of the voltage level translator, and
  an enable circuit having a first state that connects an external voltage supply to the sources of the first and second output signal transistors, and a second state that isolates the external voltage supply from the sources of the first and second output signal transistors in response to the ready-signal provided by the ready-signal generation circuit.

2. The circuit of claim 1, wherein the ready-signal generation circuit further comprises a resistive element connected in parallel with one transistor of the input and output transistors, and wherein the resistive element at least in part causes the at least one permanently unbalanced pair to be permanently unbalanced.

3. The circuit of claim 1, wherein the ready-signal generation circuit further comprises first and second high voltage transistors that each have essentially zero threshold voltage, and that mediate the connections between the pair of input transistors of the ready-signal generation circuit and the pair of output transistors of the ready-signal generation circuit.

4. The circuit of claim 1, wherein the pair of input transistors of the ready-signal generation circuit is permanently unbalanced.

5. The circuit of claim 1, wherein the pair of output transistors of the ready-signal generation circuit is permanently unbalanced.

6. The circuit of claim 1, wherein the pair of input transistors of the ready-signal generation circuit is unbalanced and wherein the pair of output transistors of the ready-signal generation circuit is unbalanced.

7. The circuit of claim 6, wherein the pair of input transistors of the ready-signal generation circuit is permanently unbalanced and wherein the pair of output transistors of the ready-signal generation circuit is permanently unbalanced.

8. The circuit of claim 1, wherein the at least one of the pairs of input transistors and output transistors that is permanently unbalanced includes transistors having a differing transistor parameter, the differing transistor parameter at least in part causing the at least one of the pairs of input transistors and output transistors that is permanently unbalanced to be permanently unbalanced.

9. The circuit of claim 1, wherein the gate of the first input transistor of the pair of input transistors of the ready-signal generation circuit is directly connected to the internal voltage supply.

10. A circuit comprising:
a ready-signal generation circuit for providing a ready-signal indicating that an internal voltage supply is at an operating voltage, the ready-signal generation circuit comprising
a pair of input transistors, the gate of a first input transistor of the pair of input transistors receiving a signal from the internal voltage supply, and the gate of a second input transistor of the pair of input transistors receiving a complementary signal of the signal from the internal voltage supply, and
a pair of output transistors,
the drain of a first output transistor of the pair of output transistors connected to the gate of a second output transistor of the pair of output transistors, to the drain of the first input transistor, and to an output complementary signal node of the ready-signal generation circuit,
the drain of the second output transistor connected to the gate of the first output transistor, to the drain of the second input transistor, and to an output signal node of the ready-signal generation circuit,
wherein both of the pairs of input transistors and output transistors are unbalanced; and
a voltage level translator for providing an output signal having an external voltage in response to an input signal having an internal voltage, the voltage level translator comprising first and second input signal transistors, the gate of the first input signal transistor receiving the input signal, and the gate of the second input signal transistor receiving an input complementary signal of the input signal, first and second output signal transistors, the drain of the first output signal transistor connected to the gate of the second output signal transistor, to the drain of the first input signal transistor, and to an output complementary signal node of the voltage level translator, the drain of the second output signal transistor connected to the gate of the first output signal transistor, to the drain of the second input signal transistor, and to an output signal node of the voltage level translator, and an enable circuit having a first state that connects an external voltage supply to the sources of the first and second output signal transistors, and a second state that isolates the external voltage supply from the sources of the first and second output signal transistors in response to the ready-signal provided by the ready-signal generation circuit.

11. The circuit of claim 10, wherein the ready-signal generation circuit further comprises a resistive element connected in parallel with one transistor of the input and output transistors of the ready-signal generation circuit.

12. The circuit of claim 10, wherein the ready-signal generation circuit further comprises first and second high voltage transistors that each have essentially zero threshold voltage, and that mediate the connections between the pair of input transistors of the ready-signal generation circuit and the pair of output transistors of the ready-signal generation circuit.

13. The circuit of claim 10, wherein the pair of input transistors of the ready-signal generation circuit is permanently unbalanced.

14. The circuit of claim 10, wherein the pair of output transistors of the ready-signal generation circuit is permanently unbalanced.

15. The circuit of claim 10, wherein the pair of input transistors of the ready-signal generation circuit includes transistors having a differing transistor parameter, the differing transistor parameter at least in part causing the unbalancing of the pair of input transistors of the ready-signal generation circuit.

16. The circuit of claim 10, wherein the pair of output transistors of the ready-signal generation circuit includes transistors having a differing transistor parameter, the differing transistor parameter at least in part causing the unbalancing of the pair of output transistors of the ready-signal generation circuit.

17. The circuit of claim 10, wherein the gate of the first input transistor of the pair of input transistors of the ready-signal generation circuit is directly connected to the internal voltage supply.

* * * * *